United States Patent [19]
Winters et al.

[11] Patent Number: 5,532,693
[45] Date of Patent: Jul. 2, 1996

[54] ADAPTIVE DATA COMPRESSION SYSTEM WITH SYSTOLIC STRING MATCHING LOGIC

[75] Inventors: Kel D. Winters; Patrick A. Owsley; Catherine A. French; Robert M. Bode; Peter S. Feeley, all of Moscow, Id.

[73] Assignee: Advanced Hardware Architectures, Pullman, Wash.

[21] Appl. No.: 259,760

[22] Filed: Jun. 13, 1994

[51] Int. Cl.⁶ .................................................. H03M 7/30
[52] U.S. Cl. .................................................. 341/51
[58] Field of Search ................................ 341/51, 52, 55, 341/94, 95, 87, 106

[56] References Cited

U.S. PATENT DOCUMENTS

| 4,021,782 | 5/1977 | Hoerning | 340/172.5 |
| 4,056,809 | 11/1977 | Hoerning et al. | 364/200 |
| 4,558,302 | 12/1985 | Welch | 340/347 DD |
| 5,003,307 | 3/1991 | Whiting et al. | 341/51 |
| 5,016,009 | 5/1991 | Whiting et al. | 341/67 |
| 5,373,290 | 12/1994 | Lempel et al. | 341/51 |

OTHER PUBLICATIONS

T. Bell, "A Unifying Theory and Improvements for Existing Approaches to Text Compression," Dept. of Computer Science, Univ. of Canterbury, Christchurch, New Zealand, 1986.
T. Bell, J. Cleary and I. Witten, "Text Compression", Prentice-Hall, Englewood Cliffs NJ, 1990.
J. Ziv. and A. Lempel, "Compression of Individual Sequences via Variable Rate Coding", IEEE Transactions on Information Theory, vol. 24, No. 5, pp. 530–536, Sep. 1978.
Terry Welch, "A Technique for High Performance Data Compression", IEEE Computer, vol. 17, No. 6, pp. 8–19, Jun. 1984.
J. Ziv and A. Lempel, "A Universal Algorithm for Sequential Data Compression", IEEE Transactions on Information Theory vol. 23, No. 3, pp. 337–343, May 1977.
J. Storer and T. Szymanski, "Data Compression via Textual Substitution," Journal of the ACM, vol. 29, No. 4, pp. 928–951, Oct. 1982.
J. Storer, "Data Compression: Methods and Theory, Computer Science Press", Rockville MD, pp. 64–69, 146–163, 1988.

*Primary Examiner*—Brian K. Young
*Attorney, Agent, or Firm*—Haverstock & Associates

[57] ABSTRACT

An adaptive lossless data compression system with systolic string matching logic performs compression and decompression at the maximum rate of one symbol per clock cycle. The adaptive data compression system uses an improvement of the LZ1 algorithm. A content addressable memory (CAM) is used to store the last n input symbols. The CAM is stationary, stored data is not shifted throughout the CAM, but rather the CAM is used as a circular queue controlled by a Write Address Pointer Counter (WREN). During a compression operation, a new input symbol may be written to the CAM on each clock cycle, while simultaneously the rest of the CAM is searched for the input symbol. Associated with each word of the CAM array is a String Match State Machine (SMSM) and, an address logic module (ALM). These modules detect the occurrence of strings stored in the CAM array that match the current input string and report the address of the longest matching string nearest to the Write Address Pointer. The SMSM modules constitute a systolic logic array, where state information is shifted synchronously in the direction of the Write Address Pointer. The strings are represented by a string code which includes a length value, representing the length of the string, and a position value, representing the position in the CAM of the beginning of the string. During a decompression operation, the single symbols and string codes are input to the system. The symbols are stored in the CAM and the control logic outputs the decompressed data symbols using the stored data and the string codes.

31 Claims, 9 Drawing Sheets

ADAPTIVE DATA COMPRESSION SYSTEM WITH SYSTOLIC STRING MATCHING LOGIC

FIELD OF THE INVENTION

This invention relates to the field of data compression and decompression. More particularly, this invention relates to data compressors which compress data using an adaptive scheme.

BACKGROUND OF THE INVENTION

Data compression is a technique that can be used when either storing or transmitting a block of data which contains some redundancy. By compressing such a block of data its effective size can be significantly reduced without reducing the amount of information that is carried by the particular data block. Data compression increases the density of information that is to be stored or communicated by reducing the amount of memory needed to store the block of data or the transmission time necessary to transmit such a block of data. There are three significant characteristics that are used to evaluate data compressors; how efficient the compressor is, how fast the compressor is, and can the compressor fully reproduce the block of data without introducing any error.

The efficiency of a data compressor is measured in a quantity called a compression ratio which is calculated by dividing the number of uncompressed characters by the number of compressed characters. The higher the compression ratio the greater the density of the compressed data. A compression ratio of 2 denotes that the number of characters after compression is half of the number of characters before compression.

Another important characteristic of a data compressor is how closely the output from the decompressor matches the original input. Compression techniques can be divided into two subdivisions, lossless and lossy. Lossless methods allow the exact reconstruction of the original data from the compressed data. Lossless methods are most appropriate for text compression applications or other applications where it is essential that the data be fully restored to its original condition. Lossy methods allow for some error to occur during compression and decompression. These types of methods are used where a good approximation is sufficient, such as on digitally sampled analog data.

The speed of a data compressor is also a very important characteristic to be considered. Devices that interact with a computer must be fast enough to allow the computer to function efficiently without creating a bottleneck in the system. In order to be beneficial to the system a data compressor must interface with the computer without slowing down its operation.

A common method of adaptive data compression is dictionary based compression. Dictionary based compression begins with an empty table of symbol strings and builds the table as the data is compressed so that the contents of the string table will reflect the characteristics of the particular data block. Using this method, a compression ratio above 1 can be achieved if the number of bits required to represent a symbol string is less than the average length of repeated symbol strings.

Two adaptive data compression schemes which construct a dictionary of codes representing unique strings of previous data symbols were proposed by Jacob Ziv and Abraham Lempel in 1977 and 1978. The first is known as LZ1 or LZ77. The LZ1 algorithm was analyzed and improved upon by T. C. Bell in his doctoral thesis entitled "A Unifying Theory and Improvements for Existing Approaches to Text Compression," Department of Computer Science, University of Canterbury, Christchurch, New Zealand, 1986. A summary of Bell's work can also be found in the book "Text Compression", by Bell Cleary & Witten, Prentice Hall, 1990. One of the most useful of Bell's enhancements to LZ1 is what is known as the LZB algorithm.

The LZB algorithm involves storing the last n symbols from the input data stream in a first-in-first-out (FIFO) buffer. The input data stream is compared to the contents of the buffer, and each time an input symbol string matches a string in the buffer, the symbol string is encoded as a code pair. The code pair consists of a first value representing the length of the string and a second value representing the string's position in the buffer.

The LZB data compression algorithm compares the input data stream to its previous n symbols stored in a FIFO buffer. Strings of input symbols that match strings in the buffer of at least two symbols in length are encoded as code pairs. Strings that do not are simply transmitted unaltered. Code pairs consist of two values, a length l and a position p. The length l represents the length in symbols of the match string, and the position p is the distance from the current input to the most recent instance of the match string in the input stream.

Table 1 illustrates the encoding of the stream of symbols RINTINTIN. The first four symbols, RINT, are not found in the buffer and are output unaltered. The next three symbols, INT, match the previous three at a displacement of -3. The final two input symbols, IN, continue to match at a displacement of -3, so that the last five symbols INTIN are encoded with the pair (5, -3). Note that the value of a code pair length may exceed that of the position.

Code pairs and unencoded bytes (i.e., when no match has occurred) can be further encoded using either fixed length or variable length codes. Bell's thesis shows that encoding the length, l, and the position, p, of code pairs using variable length codes generally results in further compression. Bell also points out that a flag bit must be sent with each code pair or unencoded byte so that the decompressor can distinguish between them. The flag bits along with the fixed or variable length encodings will be referred to as the postcode.

TABLE 1

| LZ1 Compression Example | |
|---|---|
| Input Char | Output Code |
| R | "R" |
| I | "I" |
| N | "N" |
| T | "T" |
| I | |
| N | (5,–3) |
| T | |
| I | |
| N | |

Decompression also utilizes a FIFO buffer, however, no searching is necessary. Decoding of the output of the previous example is shown in Table 2. It is assumed that any postcode has already been decoded. The first four primitive symbols RINT are output unaltered and stored in the buffer. Next, the code pair (5, -3) which represents the last three symbols in the buffer INT plus the next two symbols, IN, that follow after the new INT string, is added to buffer.

TABLE 2

| LZ1 Decompression Example | |
|---|---|
| Input | Output Char |
| "R" | R |
| "I" | I |
| "N" | N |
| "T" | T |
| (5,–3) | INTIN |

The second Lempel-Ziv algorithm was introduced in an article entitled "Compression of Individual Sequences via Variable Rate Coding", IEEE Transactions on Information Theory, Vol. 24, No. 5, pages 530–536 (September 1978). This method constructs a table or dictionary of symbol strings from the data as it is input to the compressor. Then the next time that a specific string is encountered, its corresponding dictionary index will be transmitted instead of the symbol string. This compression scheme is referred to as LZ78 or LZ2.

In 1984 Terry Welch proposed a variation on the LZ2 procedure in "A Technique For High-Performance Data Compression", IEEE Computer, Vol. 17, No. 6, pages 8–19 (June 1984). This data compression scheme is referred to as the LZW algorithm. It is organized around a table, made up of strings of characters, where each string is unique. Each string is referenced by a fixed length code which represents the longest matching string seen thus far in the previous input plus the one byte that makes this string different from prior strings. In U.S. Pat. No. 4,558,302 Terry Welch presents a hardware implementation of the LZW algorithm utilizing a Random Access Memory (RAM) and a limited search hashing procedure to search through the string table and enter extended strings in the random access memory.

Both algorithms are based on the search of a larger buffer or dictionary for the occurrence of previously encountered symbol strings. Previous implementations of LZ1 and LZ2 compressors utilized conventional static RAMs for buffer or dictionary storage and hash coding methods to accelerate the search process.

The first known implementation of a CAM based LZ2 system was constructed by Advanced Hardware Architectures, Inc. in 1991 and is the subject of U.S. patent application Ser. No. 07/924,293 filed on Aug. 3, 1992. An LZB system utilizing a shift register was proposed by Whiting and George in U.S. Pat. No. 5,003,307. In the Whiting system, the FIFO buffer required by the LZ1 algorithm is implemented by a hardware shift register of n words and n comparators, so that the current input symbol is compared with each word in the buffer concurrently. When multiple string matches are found in the buffer, the longest running match is identified by a controller state machine which accumulates the number of matches (corresponding to string length) for each entry in the buffer. When there is more than one instance of the longest matching string in the buffer, a priority encoding network determines the position of the most recent matching string.

Associated with each buffer word in the Whiting system is a flip-flop whose output, String(j), indicates whether the buffer string ending in location j has continually matched the current input string. At the beginning of each string search, all n flip-flops are preset to 1 by a StartString signal from the controller state machine. String(j) is asserted for each word in the array until a mismatch is detected in location j. The end of a symbol string is reached when all String(j) outputs have been disabled. This is reported to the controller state machine by a signal Match?, which is the logic OR of all String(j) signals. While the control logic for the StartString signal is not disclosed in the Whiting patent, presumably Match? is used to assert StartString for at least a portion of a clock cycle to initiate a search for a new string in the array.

In U.S. Pat. No. 5,016,009 to Whiting et al., another implementation of the LZB algorithm is presented. In this case, rather than utilizing a shift register means, a hashing table is used.

What is needed is an adaptive data compression system which utilizes an enhanced version of the LZ1 algorithm and uses a memory which does not require the data to be shifted and does not require a hashing table, but will allow compression or decompression to occur at a maximum rate of one symbol per clock cycle.

SUMMARY OF THE PRESENT INVENTION

An adaptive lossless data compression system with systolic string matching logic performs compression and decompression at a maximum rate of one symbol per clock cycle. The adaptive data compression system uses an improvement of the LZ1 algorithm. A content addressable memory (CAM) is used to store the last n input symbols. The CAM is stationary, stored data is not shifted throughout the CAM, but rather the CAM is used as a circular queue controlled by a Write Address Pointer Counter (WREN).

During a compression operation, a new input symbol may be written to the CAM on each clock cycle, while simultaneously the rest of the CAM is searched for the input symbol. Associated with each word of the CAM array is a String Match State Machine (SMSM). SMSM modules detect the occurrence of strings stored in the CAM array that match the current input string and report the address of the longest matching string nearest to the Write Address Pointer. The SMSM modules constitute a systolic logic array, where state information is shifted synchronously in the direction of the Write Address Pointer. The strings are represented by a string code which includes a length value, representing the length of the string, and a position value, representing the position in the CAM of the beginning of the string.

During a decompression operation, the single symbols and string codes are input to the system. The symbols are stored in the CAM and the control logic outputs the decompressed data symbols using the stored data and the string codes.

DETAILED DESCRIPTION OF THE PREFERRED EMBODIMENT

Figure 1:
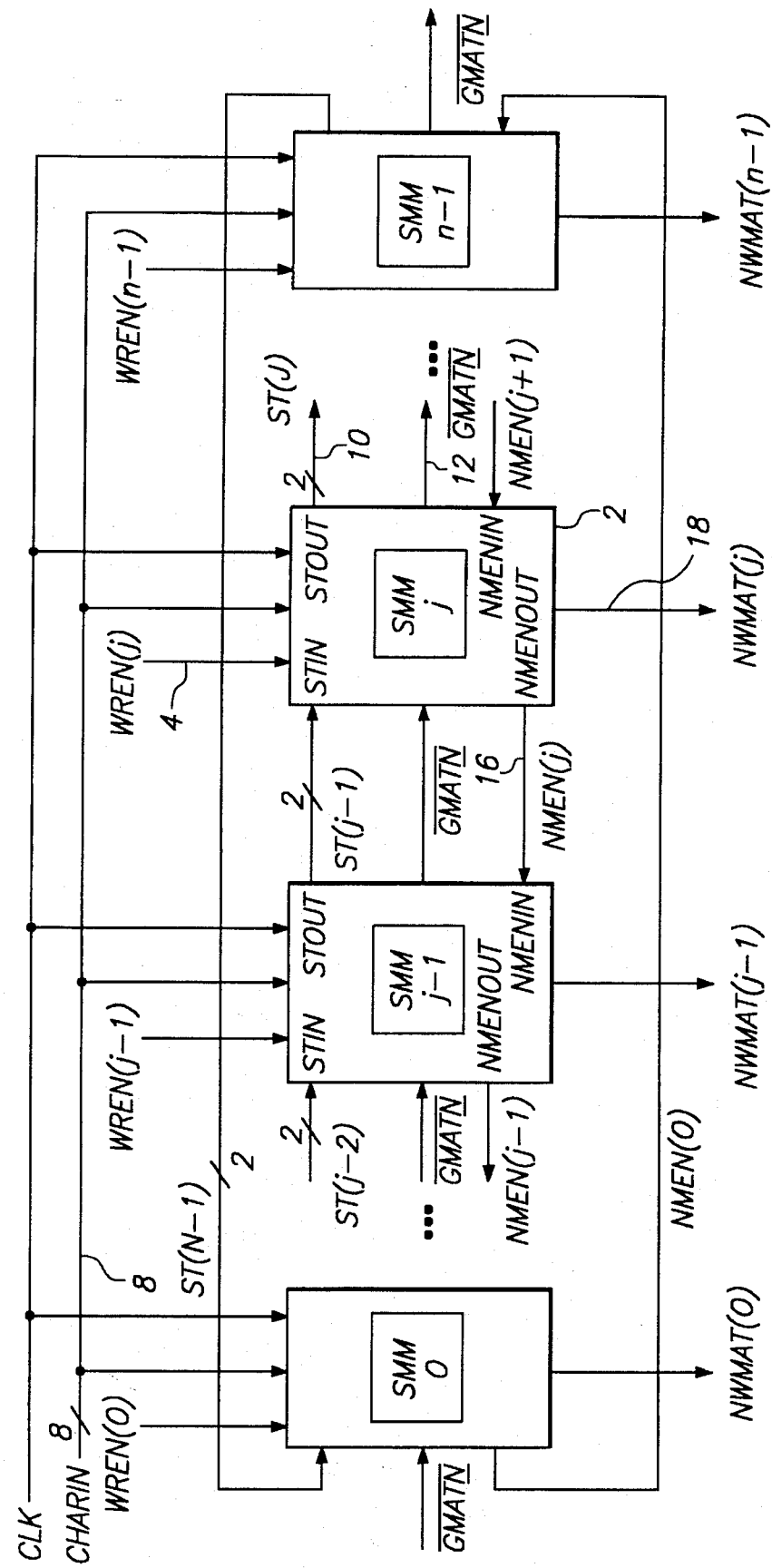
FIG. 1 illustrates the String Match Module Array of the present invention.

The active data compression system with systolic siring matching system, as shown in FIG. 1, can compress or decompress data at the rate of one uncompressed symbol per clock cycle. The system utilizes a content addressable memory (CAM) in which data can be read from, written to, or searched for. The LZ1 algorithm has been improved for use in this system to facilitate faster and more efficient data compression.

The present invention is a hardware adaptive data compression system consisting of an array of n String Match Modules (SMM), as shown in FIG. 1, and external control logic. An eight-bit Input bus CHARIN 8 carries uncompressed input symbols, a byte at a time, from an input source to each SMM.

The input source will send data to the compression system of the present invention to be compressed or decompressed a byte at a time. During compression of an input stream of data, each input symbol is stored in the CAM and during the same clock cycle the CAM is also searched for the symbol. Each string is then output to an output device such as a memory or disk, as a string code consisting of a length value and a position value. The length value represents the length in symbols of the match string, and the position value represents the distance from the first symbol in the string to the most recent instance of the match string in the previously stored stream of symbols. A single symbol that is not matched in the previously stored stream of symbols is output unaltered and is not compressed. Once the data has been compressed it will fully represent the data that was input but may take up less space in the memory, disk or other computer. The compression ratio achieved by the present invention will be dependent upon the nature of the data to be compressed.

The data compression system of the present invention can also be used to decompress data that has previously been compressed. The compressed data will be input to the compression system, including single symbols and string codes representing strings of symbols. The symbols are then written into the CAM and the data is decompressed using the stream of symbols. No searching of the CAM is necessary during decompression. When a string code is reached, the previous symbols stored in the dictionary are used to output the string of symbols that the string code represents.

The adaptive data compression system consists of array of n String Match Modules (SMM), as shown in FIG. 1. The current input symbol is written to the current String Match Module, symbolized as SMM(j) 2, by enabling the WREN(j) signal line 4. On the following clock cycle, the next input is written to the next String Match Module in the array, SMM(j+1).

The value of j starts at 0 and is incremented by 1 a maximum of once every clock cycle. While data is stationary in the array, state information is shifted between the adjacent SMMs on the state signal lines St(j) 10. The state signal lines 10 indicate that either no match is occurring, that the SMM is at the beginning of a match, or that the SMM is in the middle of a match.

A single global match ($\overline{GMATN}$) signal 12 is used to indicate when any SMM is in the middle of a match. The signal line $\overline{GMATN}$ 12 is an input and output to all of the SMMs and also an input to the control logic. If the $\overline{GMATN}$ signal line 12 is not activated, the current input symbol is output unaltered. Each SMM has a near-match-enable signal, NMEN(j) 16, the near-match-enable signals are daisy-chained between the SMMs to determine which of the SMMs reporting the longest current string match is nearest to the head of the queue. The head of the queue is considered to be the SMM in the array where the current input symbol is being written, which is where the signal line WREN 4 is active.

Each SMM also has a nearest-word-match signal, NWMAT(j) 18. No more than one nearest-word-match signal, NWMAT(j) 18, may be asserted during each clock cycle, indicating the location of the SMM containing the last symbol of the longest current string match nearest to the active WREN(j) signal 4.

Figure 2:
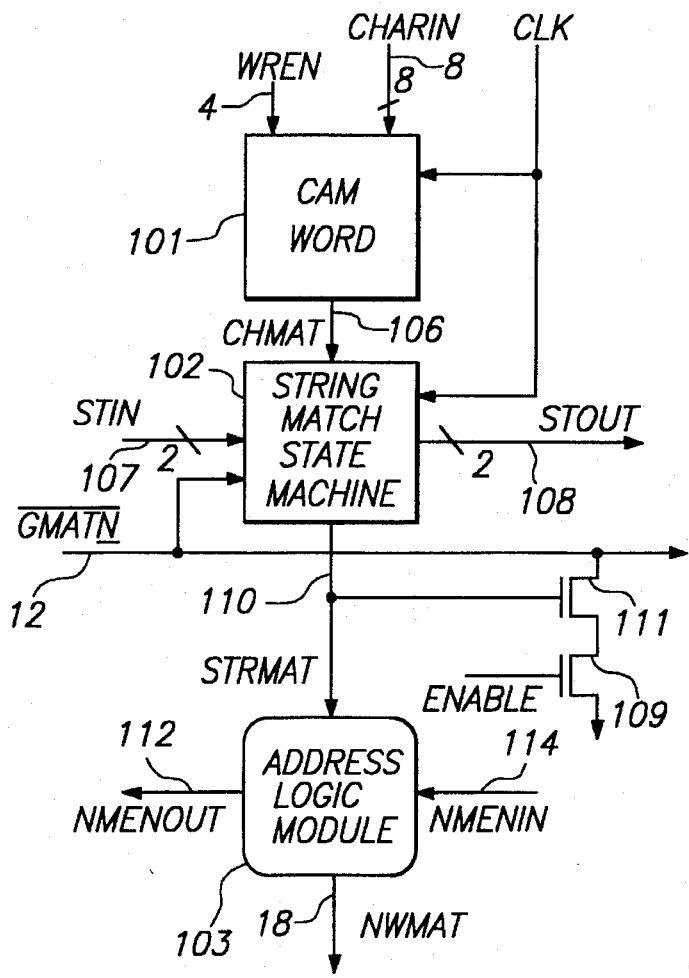
FIG. 2 illustrates an individual String Match Module.

The structure of a String Match Module (SMM) is illustrated in FIG. 2. Each SMM consists of a CAM word 101, a String Match State Machine (SMSM) 102, and an Address Logic module 103.

Each CAM word 101 stores a one byte symbol from the Input bus CHARIN 8 when the signal line WREN 4 for that SMM is active. When the signal line WREN 4 is inactive and the CAM word is not being written to, it is being searched for the input symbol that is currently being written at the head of the queue. The character match signal line CHMAT 106 is asserted when the contents of the CAM matches the symbol on the Input Bus CHARIN 8. This character match signal is then passed on to the string match state machine 102. The character match signal line CHMAT 106 is disabled when the signal line WREN 4 is active in the SMM.

The function of the SMSM 102 is to track the status of the buffer string whose last symbol resides in the associated CAM word of the present SMM. Each SMM has a pair of STOUT signal lines 108 which assert that the buffer string does not match the current input string, is at the beginning of a match, or is in the middle of a match. This pair of STOUT signal lines 108 is coupled to the next SMSM in the array as a pair of STIN signal lines 107. This state information is shifted between the SMSMs once each time a new character is input from the input bus CHARIN 8 and is passed in the same direction as the write enable signal, WREN 4.

Each SMM has a string match signal line STRMAT 110 which is coupled between the SMSM 102 and the Address Logic module 103. The signal line STRMAT 110 is asserted when the buffer string matches at least the last two characters of the current input string, e.g. is in the middle of a match. State information is shifted right, in the direction of the active WREN signal 4, on each clock cycle that a new input symbol is accepted. The global match signal line $\overline{GMATN}$ 12 is an active-low pre-charged signal line that is pulled low whenever one or more of the STRMAT signal lines 110 are active. The drain of the MOSFET 111 is coupled to the $\overline{GMATN}$ signal line 12, the source is coupled to the drain of another MOSFET 109 and the gate of the MOSFET 111 is coupled to the STRMAT signal line 110. When the STRMAT signal line 110 is active, the MOSFET 111 turns on and the $\overline{GMATN}$ signal line 12 is pulled to ground, signalling that the buffer string matches at least the last two characters of the current input string. The MOSFET 111 in series with the MOSFET 109 creates a pulldown chain for evaluating the wired-OR precharge signal $\overline{\text{GMATN}}$. The enable device 109 is used to ensure that there is no path to ground during the precharge of the signal $\overline{\text{GMATN}}$. The signal $\overline{\text{GMATN}}$ precharges on the periphery of the array of string match modules.

The Address Logic Module (ALM) 103 is a module that outputs the near word match signal line NWMAT 18 and the near match enable out signal line NMENOUT 112. The ALM 103 is a combinational logic block that determines whether a match in the SMM is nearest to the active write enable signal line WREN 4. This is required when multiple string matches occur. The ALM 103 asserts the near word match signal line NWMAT 18 when the SMM is indeed the nearest match. The signal line NWMAT 18 is derived from the signal line STRMAT 110 in the present SMSM and the near match enable in signal NMENIN 114 which is input from the adjacent SMM. When the signal line NMENIN 114 is active there are no SMMs containing active STRMAT signal lines 110 between the present SMM and the head of the queue. Therefore, the signal line NWMAT 18 asserts that the present SMM contains the last symbol of the most recent instance of the longest buffer string matching the current input string. If the signal line NMENIN 114 is active and the signal line STRMAT 110 is also active, then the present SMM contains the nearest match. If the signal line NMENIN 114 is inactive the nearest match is closer to the previous active write enable signal line WREN 4. The ALM 103 also produces an output signal NMENOUT 112 which is the signal NMENIN 114 for the adjacent SMM. The basic functions of the signal lines NWMAT 18 and NMENOUT 112 are given by the following equations:

$$NMENOUT = WREN + NMENIN * \overline{STRMAT}$$

$$NWMAT = \overline{WREN} * NMENIN * STRMAT$$

The near match enable signals NMENOUT 112 and NMENIN 114 are passed in the direction opposite to the movement of the write enable signal WREN 4.

Figure 3:
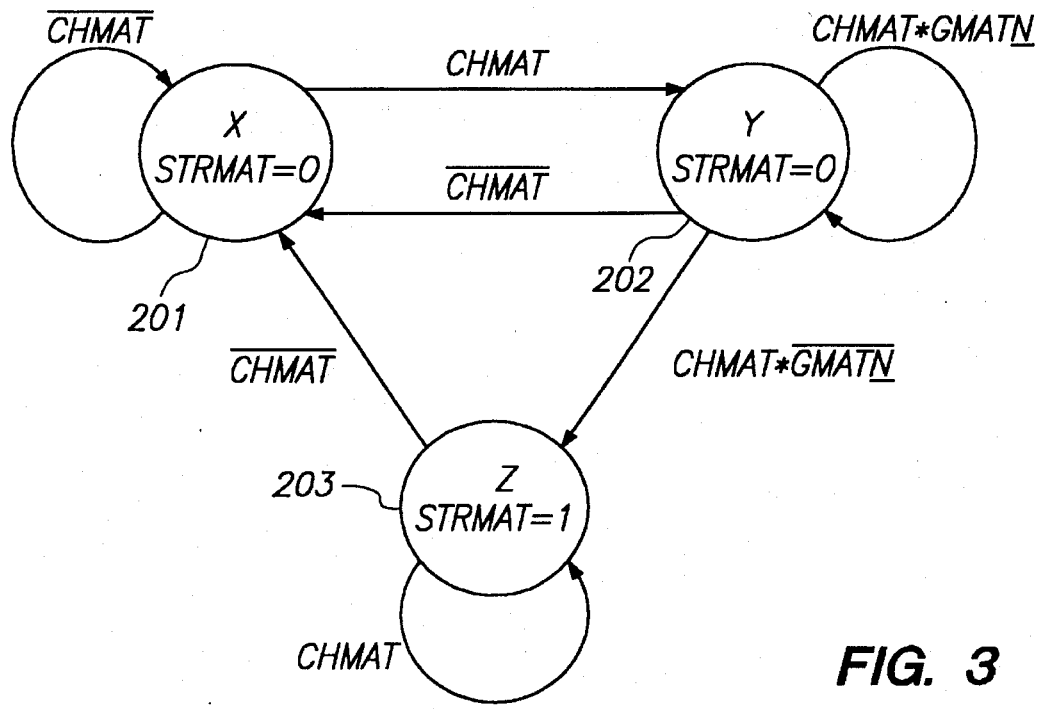
FIG. 3 illustrates a String Match State Machine State Diagram.

A state transition diagram for the String Match State Machine (SMSM) 102 is shown in FIG. 3. The SMSM 102 resembles a Moore style state machine in that its output, the signal line STRMAT 110, is only a function of the present state of the previous SMM and is not combinationally dependent upon any inputs to the previous SMM. This has the advantage of allowing greater clock speeds in applications such as the present invention.

Unlike ordinary state machines, the present state variables are not fed back as inputs to the next state logic, rather they are shifted to the SMSM in the adjacent SMM in the array. Therefore, SMSM modules may be thought of as synchronous logic array elements. It should be noted that the SMSM function and the global match protocol presented here would provide clock rate improvements to a Whiting style compression architecture as well, where the input data physically shifts in the buffer and the SMSM state information remains stationary. Thus, in a Whiting style architecture, the SMSMs would appear as ordinary Moore style state machines.

The SMSM 102 determines whether the contents of the CAM word 101 does not match the current input string, is at the beginning of a match, or matches at least the last two characters of the current input string. The SMSM 102 is initialized to the state X 201, which denotes that the word stored in the CAM word 101 for the SMM does not match the current input symbol being stored at the head of the queue. When the CHMAT signal line 106 is activated signalling that the word stored in the CAM word 101 matches the current input symbol being stored at the head of the queue, the SMSM 102 moves to the state Y 202, indicating that only the last input symbol was matched. Since single-symbol strings are not encoded in the algorithm of the present invention, this information is not reported to the external control logic.

If the SMSM 102 is already in the state Y 202, a second matching character may move the SMSM from the state Y 202 to the state Z 203 only if the global match signal line $\overline{\text{GMATN}}$ 12 is not yet active signalling that there is more than one character that has been matched.

The state Z 203 denotes that the present SMM has detected a compressible match string of the greatest known length. Here the signal line STRMAT 110 is activated, for the SMM whose SMSM has moved to the state Z 203, which activates the signal line $\overline{\text{GMATN}}$ 12. Since more than one instance of the longest match may occur, more than one SMM may assert the signal line STRMAT 110 and move to the state Z 203 in the same clock cycle, indicating that multiple instances of the current longest match string have been detected.

The signal line $\overline{\text{GMATN}}$ 12 must be deasserted for at least one clock cycle between each match string in order for the state machine to function properly. This is easy to achieve and does not affect the decompression rate of the present invention because strings of one character in length are not encoded. Therefore, the signal line $\overline{\text{GMATN}}$ 12 protocol is fully synchronous, making the greatest utilization of the clock cycle, and requires no dead cycles between match strings. Therefore, the input stream may be compressed at a maximum rate of one symbol per clock cycle.

If the signal $\overline{\text{GMATN}}$ 12 transitions from active to inactive, then a string match has terminated and the code pair associated with the match length and the position of the matching string nearest the active signal WREN is output. The length of the matching string is one character larger than the number of cycles that the signal $\overline{\text{GMATN}}$ 12 was active. The position of the matching string is the difference between the location of the previous active signal line WREN 4 and the previous active signal line NWMAT 18. If the signal $\overline{\text{GMATN}}$ 12 has been inactive for at least two cycles, then the previous character written to the CAM is output unaltered.

To facilitate greater efficiency and faster compression of the data, a content addressable memory (CAM) is used in the present invention during both compression and decompression. Content addressable memory cells perform typical random access memory read and write operations, and they also have the additional capacity to determine if the data being searched for matches the data that is stored in the cell. If there is matching data stored in the memory then a signal is placed on the character match signal line CHMAT 106 to notify the SMSM 102. The content addressable memory may be static or dynamic.

The preferred embodiment for the present invention consists of 1024 String Match Modules, each containing a CAM word. Therefore, the CAM that will be used with the preferred embodiment of the present invention will have to be capable of storing 1024 bytes.

To compress the stream of input characters, RINTINTIN, illustrated above, the compression system of the present invention inputs those characters, one at a time from an input source and then outputs the representative compressed data. For illustration purposes assume that the CAM has been initialized to contain all 0's and the SMSMs are initialized to the state X. The first character in the input stream is R. Because this is the first input character, the WREN signal line 4 for the first String Match Module in the array is activated and the character R is written to the CAM word of the first SMM. During the same clock cycle as the character R is written to the first CAM word, every other CAM word in the array is searched for the character R. Because no other CAM word contains the character R, all CHMAT signals remain inactive, all SMSMs remain in the state X, and the signal line $\overline{\text{GMATN}}$ remains inactive.

During the next clock cycle, the next character I is input, the WREN signal line 4 for the next SMM is activated and the character I is written to the CAM word of the second SMM. During this clock cycle every other CAM word in the array is searched for the character I. Because no other CAM word contains the character I, the signal line $\overline{\text{GMATN}}$ remains inactive and the previously written character, R, is output.

During the next clock cycle, the next character N is input, the WREN signal line for the next SMM is activated and the character N is written to the CAM word of the third SMM. During this clock cycle every other CAM word in the array is searched for the character N. Because no other CAM word contains the character N, the signal line $\overline{\text{GMATN}}$ remains inactive and the previously written character, I, is output.

During the next clock cycle, the next character T is input, the WREN signal line 4 for the next SMM is activated and the character T is written to the CAM word of the fourth SMM. During this clock cycle every other CAM word in the array is searched for the character T. Because no other CAM word contains the character T, the signal line $\overline{\text{GMATN}}$ remains inactive and the previously written character, N, is output.

During the next clock cycle, the next character I is input, the WREN signal line 4 for the next SMM is activated and the character I is written to the CAM word of the fifth SMM. During this clock cycle every other CAM word in the array is searched for the character I. Because the CAM word of the second SMM does match the current input symbol I, its CHMAT signal line 106 is asserted. The SMSM 102 of the second SMM analyzes the STIN signal lines 107 which are currently in the State X and the CHMAT line 106 to determine what state to move to. The STOUT signal lines 108 are activated to indicate that a character has been matched and that the SMSM 102 is in the state Y. The STRMAT signal line 110 is not asserted because the last two characters of the current input string have not been matched. Thus the $\overline{\text{GMATN}}$ signal is still inactive and the previously written T is output.

During the next clock cycle, the next character N is input, the WREN signal line for the next SMM is activated and the character N is written to the CAM word of the sixth SMM. During this clock cycle every other CAM word in the array is searched for the character N. Because the CAM word of the third SMM does match the current input symbol N, its CHMAT signal line 106 is asserted. The SMSM then analyzes the CHMAT signal line and the STIN signal lines 107 from the previous SMM, which inform it that the last character was also matched (i.e., STIN=State Y). The STOUT signal lines 108 are activated to indicate that two characters have been matched and the SMSM 102 moves to state Z since the signal line $\overline{\text{GMATN}}$ is not yet active. The STRMAT signal line 110 for the third SMM is activated because the buffer string matches the last two characters of the current input string. Because the STRMAT signal line 110 is activated, the MOSFET 111 is turned on and the $\overline{\text{GMATN}}$ signal line 12 is pulled to ground (i.e., active).

There are no SMMs between the third and the sixth SMMs containing an active STRMAT signal line 110, so the NMENIN signal line 114 is active. Because the NMENIN signal line 114 and the STRMAT signal line 110 are both active, the signal line NWMAT 18 is activated, asserting that the third SMM contains the last symbol of the most recent instance of the longest buffer string matching the current input string. The NMENOUT signal line 112 is then deactivated, signalling to all the previous SMMs that there is a matching string closer to the head of the queue. Because the signal line $\overline{\text{GMATN}}$ is active, no character is output during the current clock cycle.

During the next clock cycle, the next character T is input, the WREN signal line for the next SMM is activated and the character T is written to the CAM word of the seventh SMM. During this clock cycle every other CAM word in the array is searched for the character T. Because the CAM word of the fourth SMM does match the current input symbol T, its CHMAT signal line 106 is asserted The SMSM then analyzes the CHMAT signal line 106 and the STIN signal lines 107 from the previous SMM, which inform it that the last two or more characters were also matched (i.e., STIN=State Z). The STOUT signal lines 108 will indicate that the state machine is in the state Z since the signal line $\overline{\text{GMATN}}$ is active. The STRMAT signal line 110 for the fourth SMM is then activated. The $\overline{\text{GMATN}}$ signal line 12 is already at ground, because the previous STRMAT signal line 110 had been activated.

There are no SMMs between the fourth and the seventh SMMs containing active STRMAT signal lines 110, so the NMENIN signal line 114 is active. Because the NMENIN signal line 114 and the STRMAT signal line 110 are both active, the signal line NWMAT 115 is activated, asserting that the fourth SMM contains the most recent instance of the longest buffer string matching the current input string. The NMENOUT signal line 112 will be deactivated during the next clock cycle when the WREN signal line 4 for the next SMM is activated, signalling to all the previous SMMs that there is a matching string closer to the head of the queue. Because the signal line $\overline{\text{GMATN}}$ is active, no character is output during the current clock cycle.

During the next clock cycle, the next character I is input, the WREN signal line for the next SMM is activated and the character I is written to the CAM word of the eighth SMM. During this clock cycle every other CAM word in the array is searched for the character I. Because the CAM word of the second SMM and the fifth SMM do match the current input symbol I, their CHMAT signal lines 106 are asserted. Both the second and the fifth SMSMs then analyze their respective STIN signal lines 107. The second SMSM determines that the SMM before it was not matched and that the $\overline{\text{GMATN}}$ signal line 12 is at a logical low (active), so there must be a string somewhere in the buffer matching the current input string. The second SMSM then outputs on its STOUT signal lines 108 that it has only matched the current input symbol (i.e., STIN=State Y). The fifth SMSM also analyzes its CHMAT signal line 106 and STIN signal lines 107, which inform it that the last 2 or more characters were also matched (i.e., STIN=State Z). The STOUT signal lines 108 of the fifth SMSM will then indicate that it is in the state Z also since the signal line $\overline{\text{GMATN}}$ is active. The STRMAT signal line 110 for the fifth SMM is activated because the buffer string matches at least the last two characters of the current input string. The $\overline{\text{GMATN}}$ signal line 12 is already at ground because the previous STRMAT signal line 110 had been activated.

There are no SMMs between the fifth and the eighth SMMs containing active STRMAT signal lines 110, so the NMENIN signal line 114 is active. Because the NMENIN signal line 114 and the STRMAT signal line 110 are both active, the signal line NWMAT 18 is activated, asserting that the fifth SMM contains the most recent instance of the longest buffer string matching the current input string. The NMENOUT signal line 112 is then deactivated, signalling to all the previous SMMs that there is a matching string closer to the head of the queue. Because the signal line $\overline{\text{GMATN}}$ is active, no character is output during the current clock cycle.

During the next clock cycle, the next character N is input, the WREN signal line 4 for the next SMM is activated and the character N is written to the CAM word of the ninth SMM. During this clock cycle every other CAM word in the array is searched for the character N. Because the CAM word of the third SMM and the sixth SMM do match the current input symbol N, their CHMAT signal lines 106 are asserted. Both the third and the sixth SMSMs then analyze their STIN signal lines 107. The third SMSM determines that its STIN signal lines 107 show that the previous SMM was in the state Y, meaning that it had matched a character and that the $\overline{\text{GMATN}}$ signal line 12 is at a logical low, so there must be a string somewhere in the buffer that is matching the current input string. The third SMSM then stays in the state Y, as per FIG. 3. The sixth SMSM also analyzes its CHMAT signal line 106 and STIN signal lines 107, which inform it that the last two or more characters were also matched (i.e., STIN=State Z). The STOUT signal lines 108 from the sixth SMSM are activated to inform the next SMM in the array that at least the last two characters have been matched and that it is in the state Z. The STRMAT signal line 110 for the sixth SMM is activated because the buffer string matches at least the last two characters of the current input string. The $\overline{\text{GMATN}}$ signal line 12 is already at a logical low because the previous STRMAT signal line 110 had been activated.

There are no SMMs between the sixth and the ninth SMMs containing active STRMAT signal lines 110, so the NMENIN signal line 114 is active. Because the NMENIN signal line 114 and the STRMAT signal line 110 are both active, the signal line NWMAT 18 is activated, asserting that the sixth SMM contains the most recent instance of the longest buffer string matching the current input string. The NMENOUT signal line 112 will be deactivated, signalling to all the previous SMMs that there is a matching string closer to the head of the queue. Because the signal line $\overline{\text{GMATN}}$ is active, no character is output during the current clock cycle.

Assuming the next character is not the character T, then the next character is not matched and the signal line $\overline{\text{GMATN}}$ becomes inactive. The control logic then determines the length of the string, 5 characters (since the signal line $\overline{\text{GMATN}}$ was active for 4 clocks), and the displacement of the string in the CAM, 3 CAM words (since the current SMM is the ninth SMM and the sixth SMM contains the most recent instance of the longest matching buffer string). These two quantities representing the string are then output as the string code pair representing the 5 characters in the string. The $\overline{\text{GMATN}}$ signal line 12 is also reset to a logical high by the control logic.

During decompression of the data representing the characters, RINTINTIN, the representative data is input to the decompression system. The first four characters, RINT, are raw data bytes and are input, stored in the CAM and output. The string code, (5,3), representing the next five characters is input to the decompression system. The control logic then utilizes the previous characters to store in the CAM and output the next five characters, INTIN. Because the previous input characters are used to generate the data string, the CAM does not need to be searched during decompression.

HANDLING MATCH TERMINATION

In a real system it will be necessary at times to terminate a matching string externally. Examples of when a matching string should be terminated externally are (1) if match length is limited to a certain maximum value due to considerations in the design of the postcode or (2) at the end of a record.

An efficient way to handle the first case would be to externally force the global match signal to be inactive for one clock cycle after the maximum match length is reached, but not affect the CHMAT signals of the string match modules. This would allow another match to begin immediately after the current match terminates.

For an end of record, the CHMAT signals associated with all the string match modules could be disabled during the last search for a match in order to terminate the match. This would force all state machines back to the state X, and also result in the global match signal becoming inactive. This would ensure that the state machines are in the proper state when the next record begins.

ENHANCEMENT FOR FAST INITIALIZATION

Figure 4:
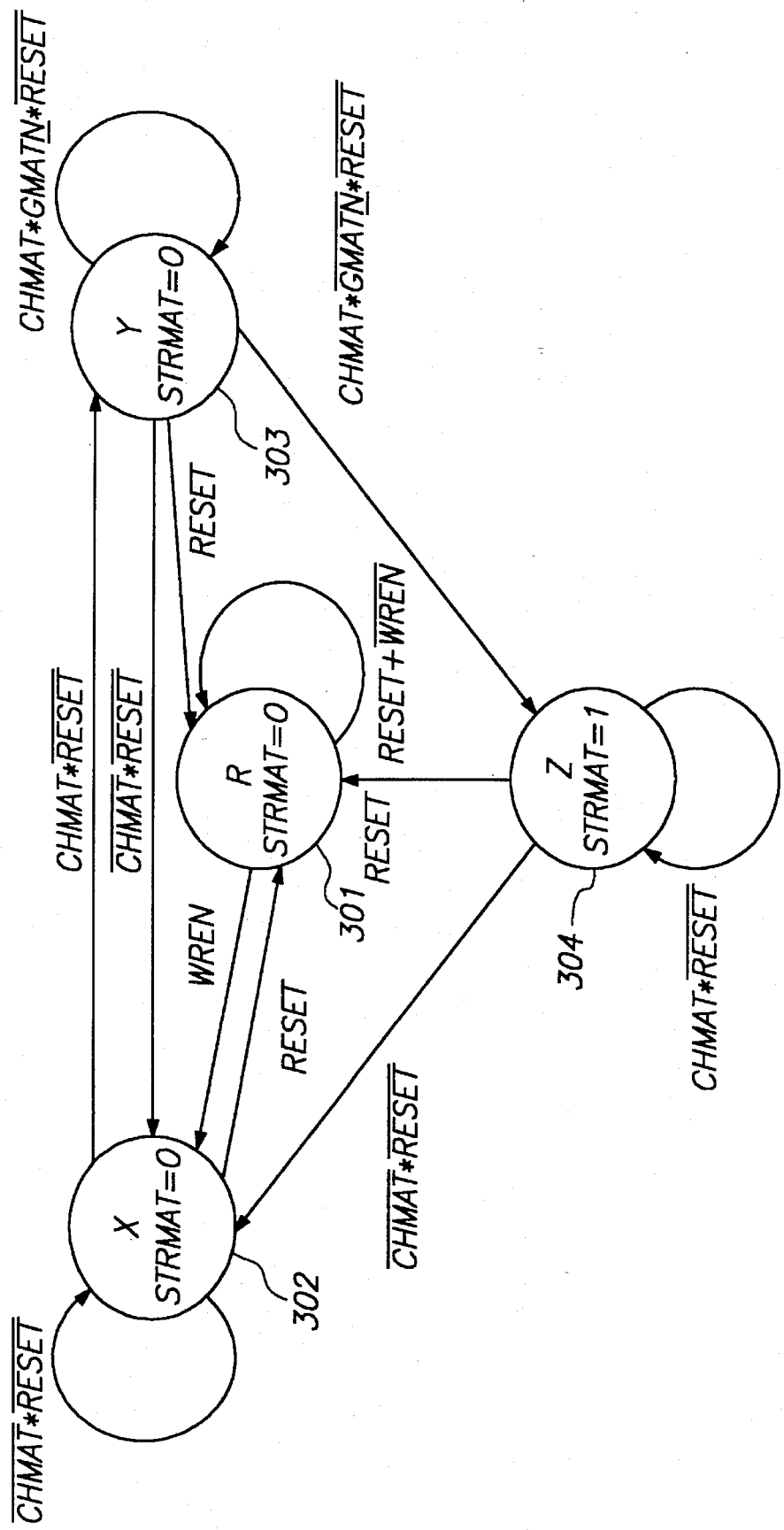
FIG. 4 illustrates an enhanced String Match State Machine State Diagram with a reset state.

Upon power-up, the proposed architecture for the preferred embodiment of the present invention requires that each address in the buffer be initialized to some value, and that the initial values be the same for both compression and decompression. A simpler and faster solution is to add one state to the String Match State Machine, as illustrated in FIG. 4. Here, all SMSMs are forced into the new state, R 301, upon hardware reset. The state R 301 signifies that the buffer word has not yet been written to, and therefore the SMSM cannot assert the global match signal. The CAM word is considered to be empty and no matches can occur during the reset state R 301. The SMSM leaves the reset state only after the CAM word for that SMM has been written to. When the signal line WREN 4 is asserted for a given buffer word, its SMSM goes to the state X 302 and begins to look for a match string. To prevent the reset state of the last module (module n-1) from being passed onto the first module (module 0), a simple logic circuit is used. This circuit will always pass a state of X if the module n-1 is in the reset state R 301. The state machine then functions as described earlier, with the exception that an active reset signal, RESET, will move all of the SMSMs back to the state R 301.

Once the state has been initialized, the signal line WREN has been asserted, and the state machine goes to the state X 302, this enhanced state machine functions just as the state machine illustrated in FIG. 3 and described above. The state machine of FIG. 4 will not go back to the state R 301 until the state machine is re-initialized.

ENHANCEMENT FOR IMPROVED CLOCK RATE

Figure 5:
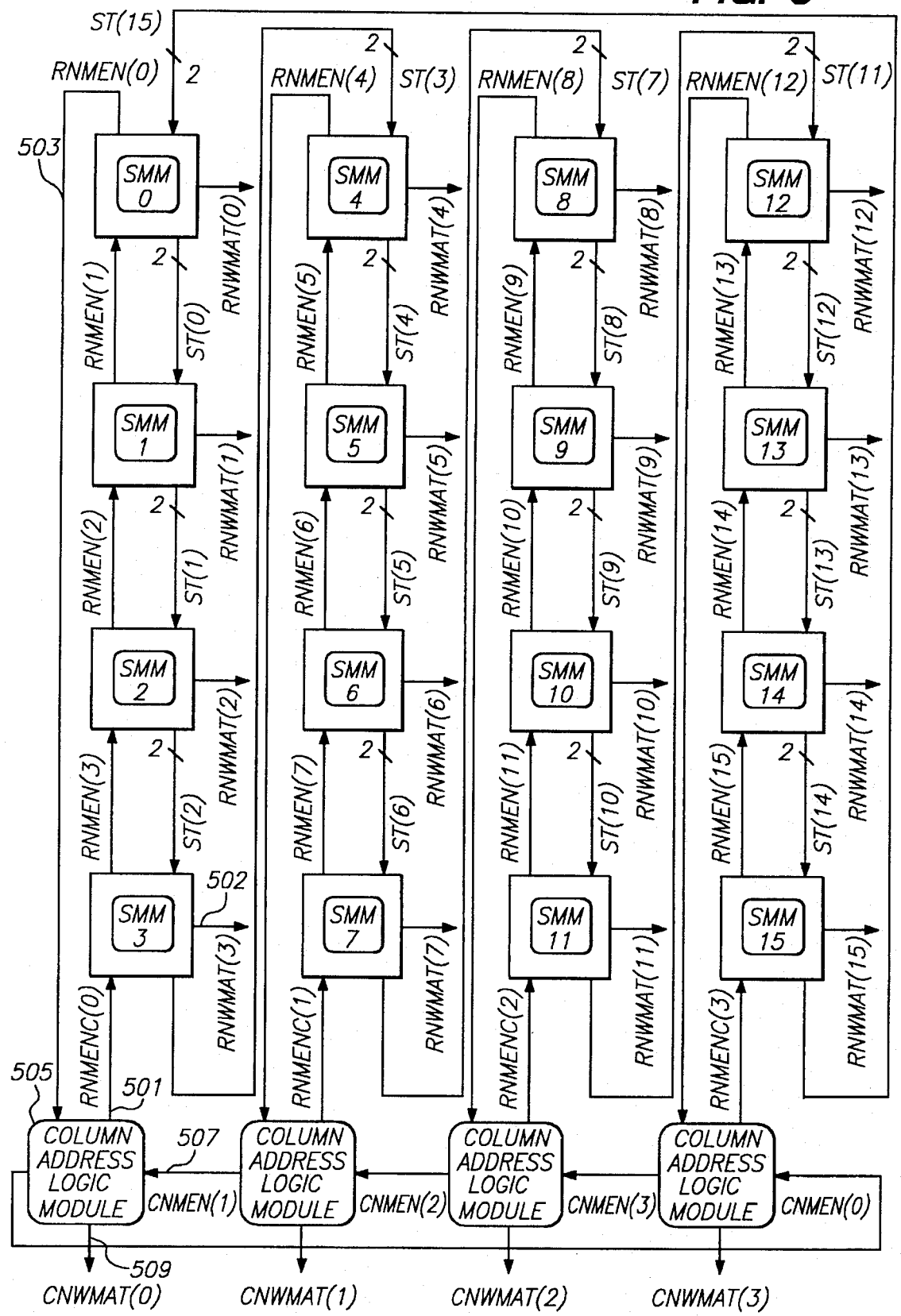
FIG. 5 illustrates an enhanced two-dimensional String Match Module Column Organization.

The clock rate of the proposed architecture may be significantly improved by partitioning two critical timing paths: the fanout of the $\overline{\text{GMATN}}$ signal lines 12 to and from each of the N String Match Modules, and the N stage daisy-chain of the NMENIN signal lines 114. This can be achieved by arranging the SMMs in a two-dimensional, rather than one-dimensional, array as illustrated in FIG. 5. The search for the nearest match can then be broken down into searching for the nearest match within a column, and searching for the nearest column.

FIG. 5 illustrates the flow of state information and nearest match information for the two-dimensional design. FIG. 5 does not show all inputs and outputs of the string match modules and the column address logic modules. Only those inputs and outputs relevant to the present invention are illustrated in FIG. 5. The string match modules are the same as those used in the one-dimensional design, and are numbered with their values of j corresponding to the direction of the active WREN signal line 4. Thus in FIG. 5, the active WREN signal line 4 is moving from top to bottom and then left to right. It should be noted that the array could also be arranged so that the WREN signal "snakes" through the array by moving from top to bottom in the odd columns and bottom to top in the even columns. The advantage of doing this would be that long routes of state information between string match modules would be avoided. The state information is passed in exactly the same way for this design as for the original one-dimensional design and the only difference in operation between the two designs is in how the nearest match is determined and how global match is implemented, as described below.

Locating the nearest match within a column is accomplished as follows. If the active WREN signal line 4 is not within the column, the nearest match within that column is considered to be the one closest to the bottom of the column. If the active WREN signal line 4 is within the column, the nearest match is the one closest to the active WREN signal line but having a smaller value of j, just as in the one-dimensional case. If the only matches within a column containing the active WREN signal line 4 are below it, the nearest match for that column is the match nearest to the bottom of the column. This functionality is accomplished by using row near match enable signals, RNMEN(j) 503 out of each string match module, row near match enable signal RNMENC(i) 501 out of each column address logic module, and row near word match signals, RNWMAT(j) 502. The RNMEN(j) signal lines 501 are analogous to the NMEN signals in the original architecture, with the exception of the RNMEN(j) signals at the very top. The RNMENC(i) signal line 501 going into the SMM at the bottom of the column is either tied to the RNMEN(j) signal line 503 out of the top of that same column if the last active WREN signal line 4 was in that column, or to a logic "1" otherwise. Finally, an active RNWMAT(j) signal line 502 indicates that the SMM contains the nearest match for that column, analogous to the NWMAT signals in the original design. There cannot be more than one active RNWMAT(j) signal line 502 per column.

For this modified scheme, column address logic modules (CALM) 505 are required for each column in addition to the ALMs in the individual SMMs. Thus, the nearest match within a column is located using the ALMs within the SMMs as discussed above, and the nearest column is located using the CALMs 505. If no match occurs within the column being written to, the nearest match is the one in the column closest to the column with the last active WREN signal line 4. Otherwise, if there is a match within the column being written to, the control logic must determine whether the match within the column being written to is above or below the active WREN signal line 4 but to the left. If the only matches are in columns to the right, the nearest column is the one farther to the right. In the former case, that match is the nearest match. In the latter case, that match is the farthest match, and would only be chosen if it were the only match present. This is all accomplished using the column near match enable signals, CNMEN(i) 507, and the column near word match signals, CNWMAT(i) 509, and the appropriate control logic. These signals are different for each column address module. Thus, an active CNWMAT(i) signal line 509 indicates that the nearest match can be found in the corresponding column.

Implementation of the global match signal for a core of SMMs broken into rows and columns requires that a signal is output either in a by row or by column sense that signals that a string match has occurred in that row or column. These signals representing a string match in their respective rows or columns are a wired OR precharge signal from each of the SMMs. These precharge signals output in a by row or by column basis, are in turn collected by a logical ORing to form the global match. Thus, if any row or column has a match the global match signal becomes active and is the output of this large ORing function. To deal with the precharge nature of this column or row signal generation, it is necessary to latch the global match signal at the end of the evaluate phase and before the beginning of the precharge phase. This global match signal is then fed back into the input of the state machines in all the SMMs, and is used as the flag for control circuitry to signal that there is a string match.

The most critical part of this two-dimensional architecture in terms of speed of operation, is the circuit which must find the nearest match in the column being written to, since this information is required before the location of the nearest column can be determined. Thus, an alternative implementation that would allow for determining the nearest match within a column at the same time as the nearest column is of interest if speed is an issue. This can be accomplished if the logic is modified slightly to simply choose one of the matches within each column using a fixed rule in all cases, regardless of where the active WREN signal line 4 is, and choose the column near word match NWMAT also using a fixed rule in all cases. For example, we could always choose the match nearest the bottom of the column and the column nearest the last active WREN signal line 4.

The consequence of this last enhancement is that the compressor will not always choose the match nearest to the active WREN signal line 4. However, it should be noted that the LZ1 algorithm does not require that we choose the nearest match to the last active WREN signal line, but simply that we choose one of the longest matches. If the post code for use after the LZ1 compressor is chosen carefully, this simplification will result in little if any degradation in terms of the compression achievable.

An additional enhancement to improve the speed of operation of this circuit would be to pipeline the STRMAT signals in the string match modules. The tradeoff in this case would be increased silicon area due to the pipelining itself and to the more complicated control circuitry required.

The present invention is different than the Data Compression Apparatus with Shift Register Means proposed by Whiting et al. because it uses random access memory cells for LZ1 string buffer storage rather than a shift register of N master-slave flip-flops. Moreover, a method is proposed in the present invention for identifying and locating the longest matching string in the buffer with the use of a single counter. A Global Match signal protocol is also defined in the present invention that allows data to be continuously compressed at a maximum rate of one symbol per clock cycle with well constrained signal paths and fanout to maximize the clock rate.

Figure 6:
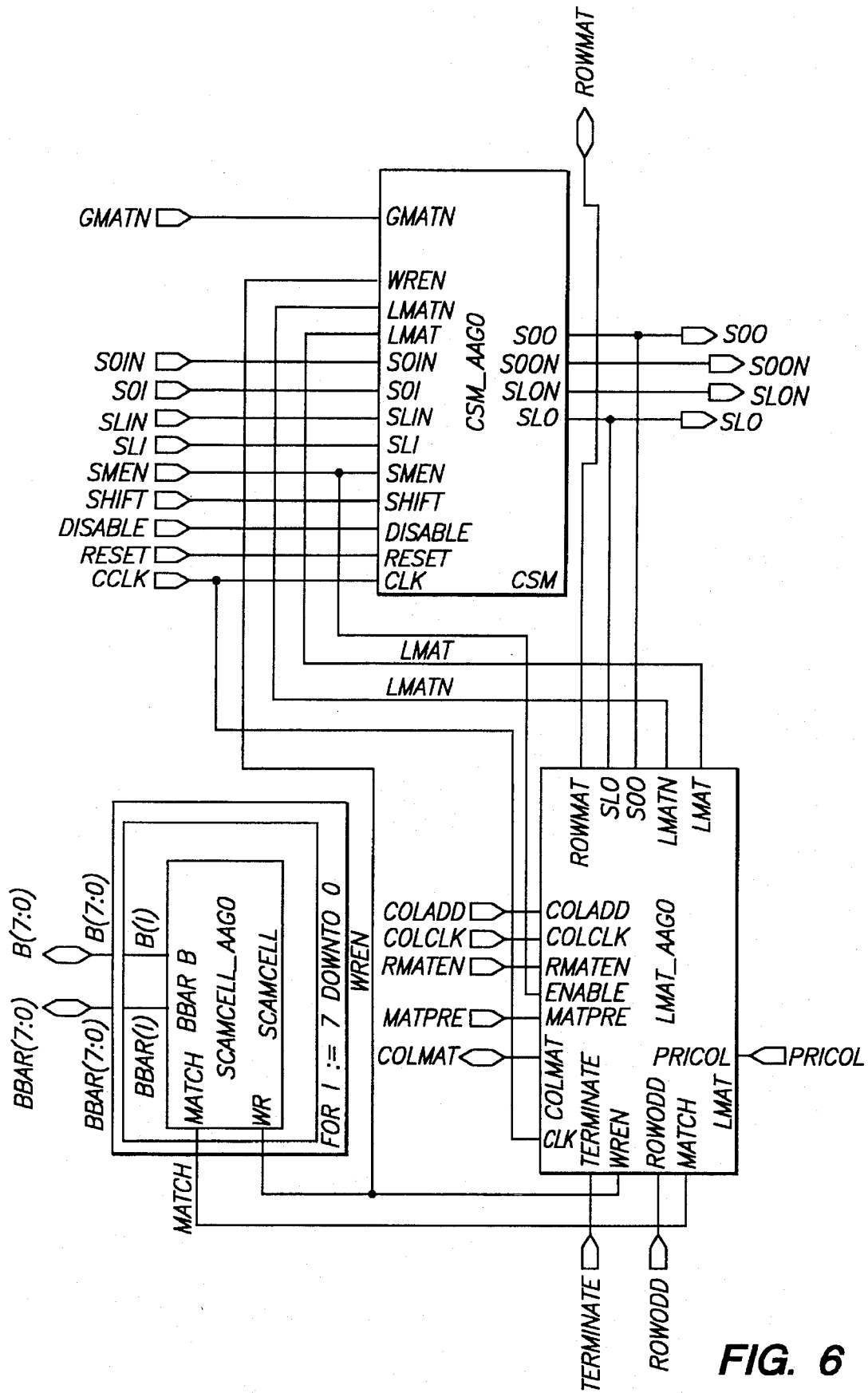
FIG. 6 illustrates a schematic diagram for a string match module of the preferred embodiment.
Figure 7:
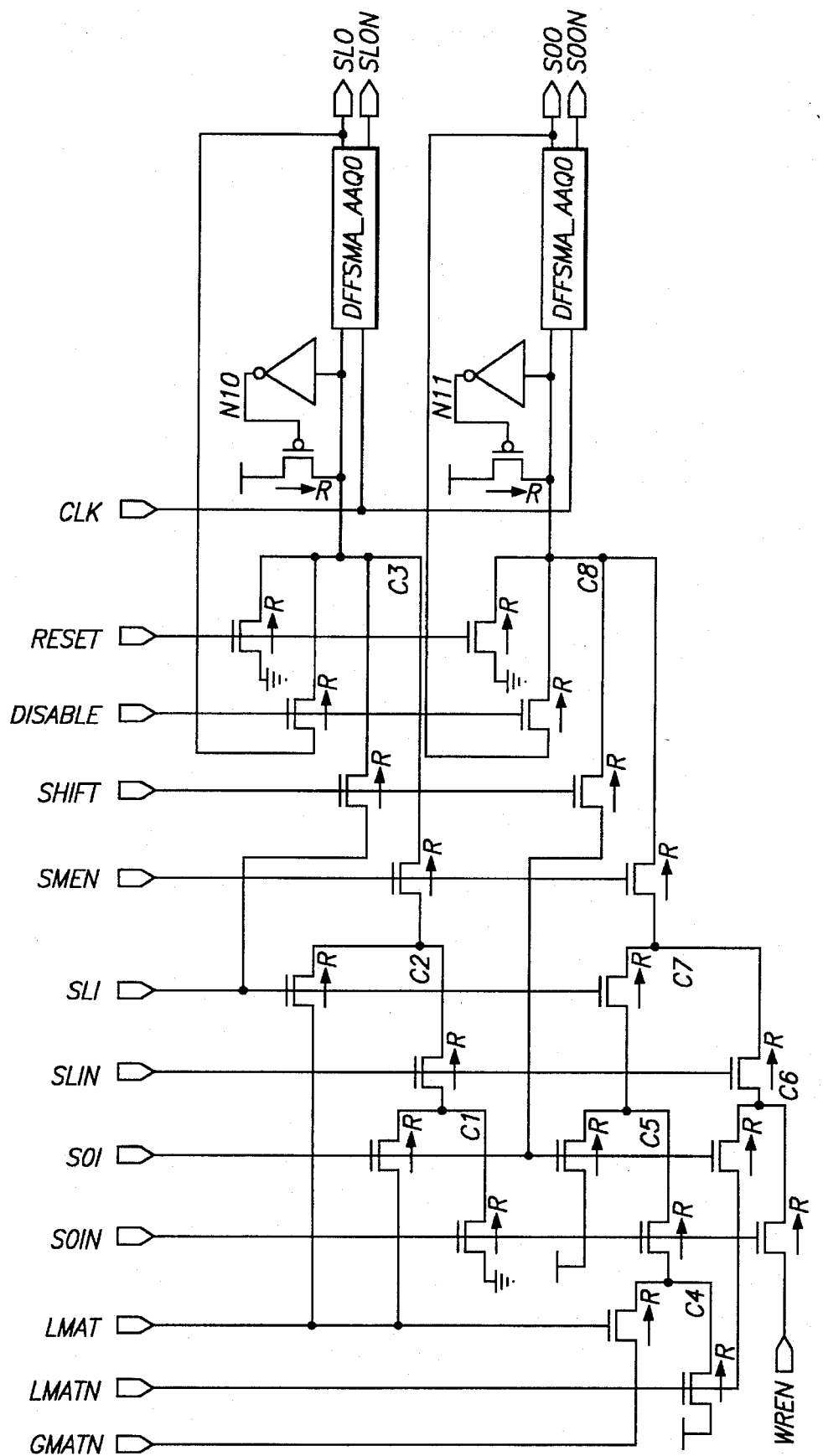
FIG. 7 illustrates a schematic diagram for a string match state machine of the preferred embodiment.
Figure 8:
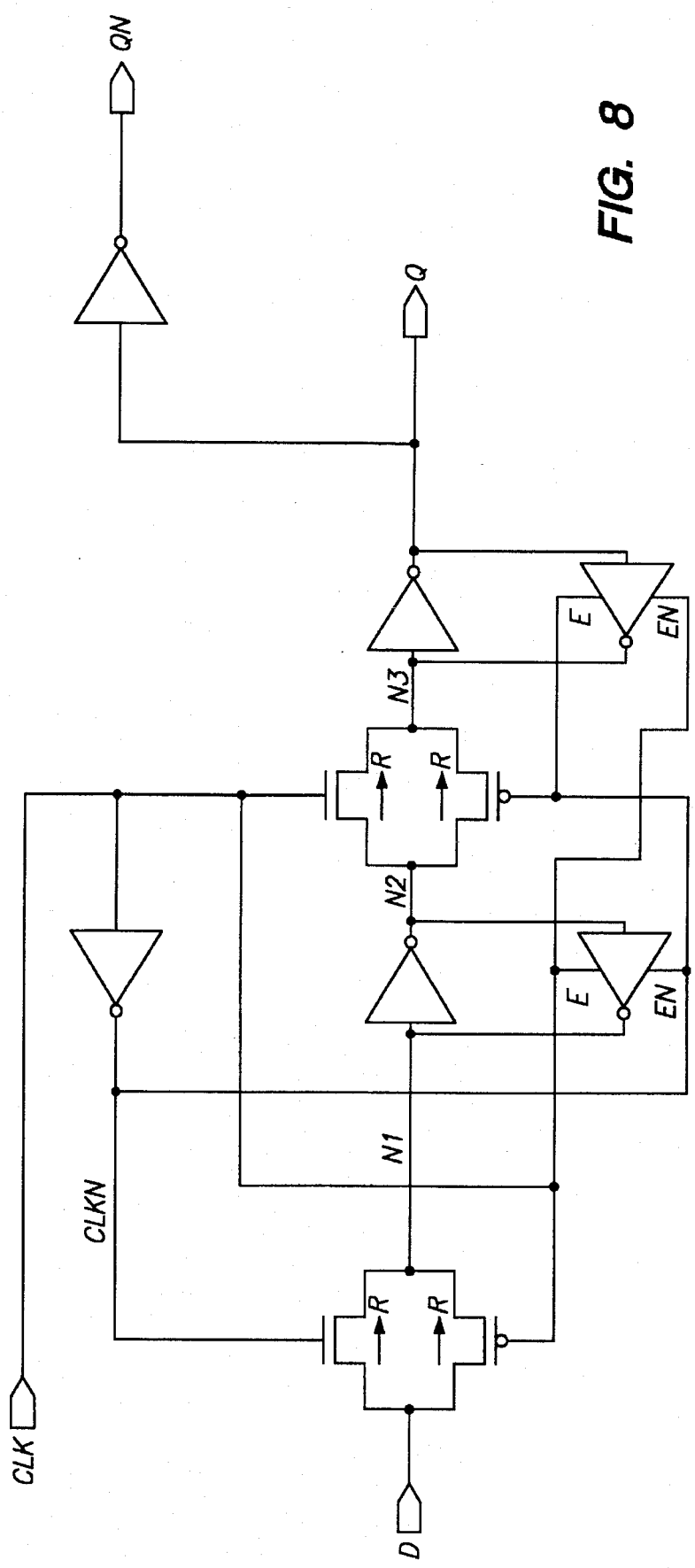
FIG. 8 illustrates a schematic diagram for a D flip-flop of the preferred embodiment.
Figure 9:
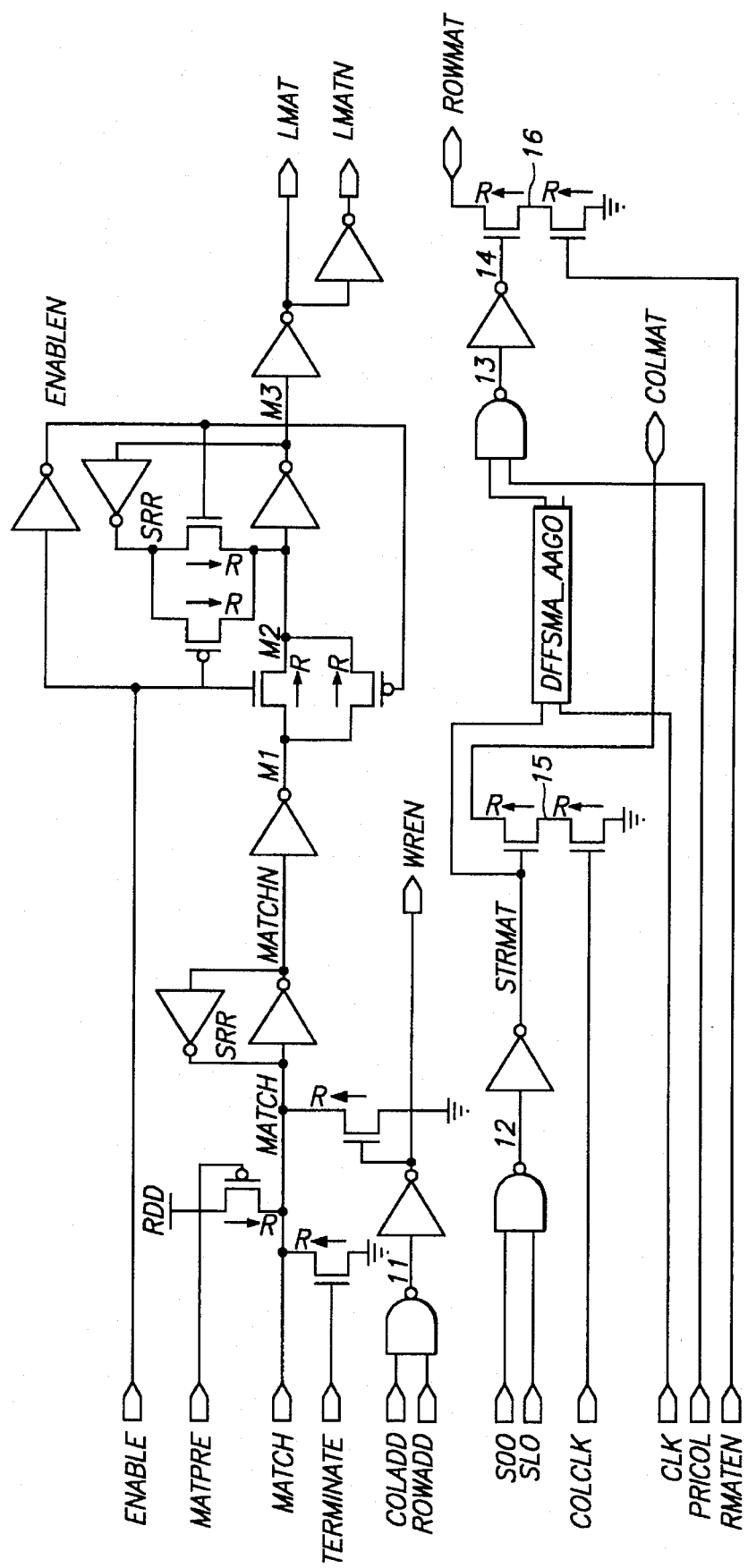
FIG. 9 illustrates a schematic diagram for the match control circuitry of the preferred embodiment.
Figure 10:
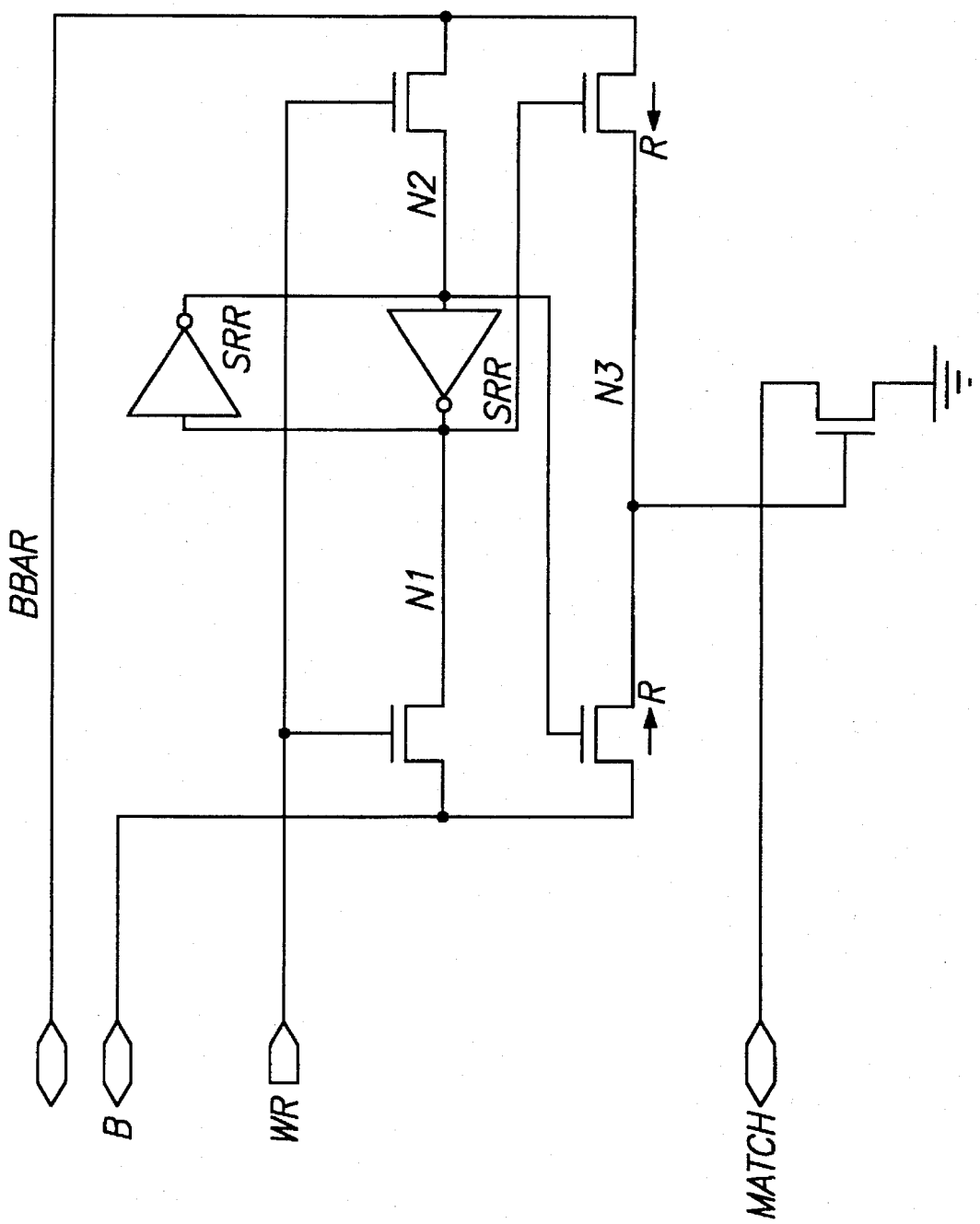
FIG. 10 illustrates a schematic diagram for a static content addressable memory cell of the preferred embodiment.

Schematic diagrams of a preferred embodiment of the present invention are illustrated in FIGS. 6–10. Currently, no silicon has been formed incorporating the preferred embodiment of the present invention. Specifically, FIG. 6 illustrates a schematic diagram for a string match module of the preferred embodiment. FIG. 7 illustrates a schematic diagram for a string match state machine of the preferred embodiment. FIG. 8 illustrates a schematic diagram for a D flip-flop of the preferred embodiment. FIG. 9 illustrates a schematic diagram for the match control circuitry of the preferred embodiment. FIG. 10 illustrates a schematic diagram for a static content addressable memory cell of the preferred embodiment.

It will be readily apparent to one reasonably skilled in the art that various modifications may be made to the preferred embodiment without departing from the spirit and scope of the invention as defined by the appended claims.

We claim:

1. A data compression system comprising:

means for sequentially receiving a plurality of data symbols from an input source; and b. means for simultaneously storing a present one of the symbols into one of a plurality of content addressable memory cells and comparing the present symbol to a plurality of previously received symbols to determine if the present symbol matches a previously received symbol wherein state information indicative of a match is transferred between the memory cells and symbols are not transferred between the memory cells.

2. The data compression system as claimed in claim 1 wherein each byte represents eight bits of information.

3. The data compression system as claimed in claim 1 wherein the content addressable memory has means for writing, searching, and reading.

4. The data compression system as claimed in claim 1 further comprising:

a. means for grouping symbols into uncoded bytes and strings, where each string comprises a longest matching string stored in the content addressable memory from the previously received signals; and b. means for generating a string code representative of each string or a previously written byte if no matching string occurs;

wherein the string code comprises a length value representative of a number of symbols in the string and a position value representative of a position of the longest matching string stored in the content addressable memory.

5. The data compression system as claimed in claim 4 further comprising means for determining which longest matching string stored in the content addressable memory is nearest in location to a last byte stored in the content addressable memory, if there is more than one longest matching string stored in the content addressable memory.

6. The data compression system as claimed in claim 1 further comprising a plurality of string match state machines, each of the string match state machines cooperatively coupled to a stored symbol in the content addressable memory.

7. The data compression system as claimed in claim 6 wherein each of the string match state machines comprise three states:

a. a first state signalling that the stored symbol does not match a current input string;

b. a second state signalling that the stored symbol matches only a last symbol of the current input string; and c. a third state signalling that a string including the stored symbol matches at least a last two symbols of the current input string.

8. The data compression system as claimed in claim 7 wherein each of the string match state machines comprise a fourth state for initialization, wherein upon a reset signal all of the string match state machines are forced into the fourth state.

9. The data compression system as claimed in claim 1 wherein the means for simultaneously storing and comparing further comprises an array of a plurality of string match modules, each string match module comprising a CAM word, a string match state machine and an address logic module.

10. The data compression system as claimed in claim 9 wherein the array of a plurality of string match modules are arranged in a one-dimensional circular queue.

11. The data compression system as claimed in claim 9 wherein the array of a plurality of string match modules are arranged in both columns and rows.

12. The data compression system as claimed in claim 1 further comprising means for decompressing previously compressed data.

13. The data compression system as claimed in claim 1 wherein the means for sequentially receiving a plurality of data symbols receives the plurality of data symbols at a rate of one symbol per clock cycle and the means for simultaneously storing and comparing processes the data at a rate of one symbol per clock cycle.

14. A data compression system comprising:

a. means for receiving data from an input source a byte at a time, each byte representing eight bits of information;

b. means for simultaneously storing a present data byte into one of a plurality of content addressable memory cells and comparing the present data byte to a plurality of previously received data bytes to determine if the present data byte matches the previously received data bytes wherein state information indicative of a match is transferred between the memory cells and data bytes are not transferred between the memory cells;

c. means for grouping data bytes into uncoded bytes and strings, where each string consists of a longest matching string stored in the content addressable memory from the previously received data;

d. means for determining which longest matching string stored in the content addressable memory is nearest to a last byte received, if there is more than one longest matching string stored in the content addressable memory; and e. means for outputting a string code representative of each string or a previously written byte if no matching string occurs.

15. The data compression system as claimed in claim 14 wherein the content addressable memory has means for writing, searching, and reading.

16. The data compression system as claimed in claim 14 wherein the string code comprises a length value representative of a number of bytes in the string and a position value representative of a position of the longest matching string stored in the content addressable memory.

17. The data compression system as claimed in claim 14 further comprising a plurality of string match state machines, each of the string match state machines cooperatively coupled to a stored byte in the content addressable memory.

18. The data compression system as claimed in claim 17 wherein each of the string match state machines comprises three states:

a. a first state signalling that the stored byte of data does not match a current input string;

b. a second state signalling that the stored byte of data matches only a last byte of the current input string; and c. a third state signalling that a string including the stored byte of data matches at least a last two characters of the current input string.

19. The data compression system as claimed in claim 18 wherein each of the string match state machines further comprise a fourth state for initialization, wherein upon a reset signal all of the string match state machines are forced into the fourth state.

20. The data compression system as claimed in claim 14 wherein the means for simultaneously storing and comparing further comprises an array of a plurality of string match modules, each string match module comprising a CAM word, a string match state machine and an address logic module.

21. The data compression system as claimed in claim 20 wherein the array of a plurality of string match modules are arranged in a one-dimensional circular queue.

22. The data compression system as claimed in claim 20 wherein the array of a plurality of string match modules are arranged in both columns and rows.

23. The data compression system as claimed in claim 14 further comprising means for decompressing previously compressed data.

24. The data compression system as claimed in claim 14 wherein the means for simultaneously storing and comparing processes the data at a rate of one byte per clock cycle.

25. A data compression system, for receiving data and compressing it at a rate of one byte per clock cycle, the compression system comprising:
   a. means for receiving data from an input source a byte at a time, each byte representing eight bits of information;
   b. an array of string match modules coupled to the means for receiving data comprising:
      i. a content addressable memory comprising a first plurality of CAM words, each CAM word capable of storing an input byte and simultaneously comparing subsequently received input bytes to stored data to determine if the subsequently received input bytes match stored data; and
      ii. a third plurality of string match state machines where state information is passed in a same direction as a direction followed by an active write pointer;
   c. means for grouping the received input bytes into uncoded bytes and strings, each string comprising a fourth plurality of input bytes;
   d. means for determining which longest matching string stored in the content addressable memory is nearest to a last byte received, if there is more than one longest matching string stored in the content addressable memory; and
   e. means for outputting a string code or a previously written byte if no matching string occurs, representative of each string, each string correspondingly matching a stored string of input bytes stored in the content addressable memory.

26. The data compression system as claimed in claim 25 wherein the string code comprises a length value representative of the number of characters in the string and a position value representative of the position of the longest matching string stored in the content addressable memory.

27. The data compression system as claimed in claim 26 further comprising means for determining which longest matching string stored in the content addressable memory is nearest to the last input byte received, if there is more than one longest matching string stored in the content addressable memory.

28. The data compression system as claimed in claim 25 further comprising a plurality of string match state machines, each of the string match state machines cooperatively coupled to a stored byte in the content addressable memory.

29. The data compression system as claimed in claim 28 wherein each of the string match state machines comprises three states:
   a. a first state signalling that the stored byte does not match a current input string;
   b. a second state signalling that the stored byte matches only a last byte of the current input string; and
   c. a third state signalling that a string including the stored byte matches at least a last two characters of the current input string.

30. The data compression system as claimed in claim 29 wherein each of the string match state machines comprise a fourth state for initialization, wherein upon a reset signal all of the string match state machines are forced into the fourth state.

31. The data compression system as claimed in claim 30 wherein the means for receiving data receives a byte of data every clock cycle and the content addressable memory can store and compare a byte of data every clock cycle.

* * * * *